United States Patent [19]
Hartke

[11] 4,162,541
[45] Jul. 24, 1979

[54] APPARATUS FOR OVERSCRIBING BINARY DATA OF A SELECTED POLARITY INTO A SEMICONDUCTOR STORE

[75] Inventor: David Hartke, Pasadena, Calif.

[73] Assignee: Xerox Corporation, Stamford, Conn.

[21] Appl. No.: 769,596

[22] Filed: Feb. 17, 1977

[51] Int. Cl.[2] .......................... G11C 5/02; G11C 7/00; G11C 8/00

[52] U.S. Cl. .................................... 365/230; 365/174; 365/234

[58] Field of Search ................................ 340/324 AD; 364/200 MS File, 900 MS File; 365/230, 234, 174

[56] References Cited

U.S. PATENT DOCUMENTS

| | | | |
|---|---|---|---|
| 3,292,151 | 12/1966 | Barnes et al. | 364/200 |
| 3,781,826 | 12/1973 | Beausoleil | 364/200 |
| 3,895,357 | 7/1975 | Schwartz et al. | 364/200 |
| 3,944,983 | 3/1976 | Gale | 364/200 |
| 3,967,251 | 6/1976 | Levine | 364/200 |
| 4,005,393 | 1/1977 | Schuerba | 365/230 |
| 4,016,545 | 4/1977 | Lipovski | 364/200 |
| 4,029,947 | 6/1977 | Evans et al. | 340/324 AD |

*Primary Examiner*—Gareth D. Shaw
*Assistant Examiner*—Michael C. Sachs
*Attorney, Agent, or Firm*—Leonard Zalman

[57] ABSTRACT

Apparatus which reduces the cycle sequences of a buffer in order to meet high data merge rates by selective control of the chip enable inputs of a plurality of memory chips. During a write ones merge cycle, data patterns from a data-in register control the chip enable inputs of the memory chips and, simultaneously, a common data input line connected to the memory chips is held at logic one. After allowing sufficient time for address decoding of selected memory chips, a common memory write line of the memory chips is enabled to write ones into the selected words of the selected memory chips, while all the other memory chips are undisturbed since their chip enable inputs have not been activated.

2 Claims, 9 Drawing Figures

APPARATUS FOR OVERSCRIBING BINARY DATA OF A SELECTED POLARITY INTO A SEMICONDUCTOR STORE

BACKGROUND OF THE INVENTION

1. Field of the Invention

The present invention relates to data processing devices, and more particularly to processing devices dedicated to control a video display for visual presentation of data generated by other processing components.

2. Description of the Prior Art

In many data processing applications the use of a video display as an interface between the machine and the user has been recognized as a desirable feature. Typically a video image may comprise either strings of characters or graphics, each of which entails differing storage requirements. Particularly in the word processing art displays of logos, handwritten notes or forms are best achieved by graphics or hereinafter referred to as a facsimile processing system. The characters themselves may be stored as dot patterns duplicating a particular font. Heretofore various technologies have been utilized or proposed for video display, such as plasma panels, light emitting diodes, liquid crystal displays or others. For large display applications, however, a cathode ray tube (CRT) offers the highest resolution for the lowest cost and is expected to maintain this favorable advantage in the foreseeable future. A high resolution CRT, however, both entails large memory requirements and more particularly high switching rates in the elements providing the video image.

The benefit of a video display is that the user can quickly ascertain whether the data or text produced is coming out in the proper form. Particularly in text processing, before the user can make any corrective steps, he typically generates one copy or rough which is then corrected to form the final copy. In each of the above instances, the desirable features of an erasable or soft display are therefore manifest. Thus in the recent years, the above described techniques of implementing a video display have been developed. The desirable features of displaying varying font, proportional spacing, under and over scoring, super and sub scripts and similar functions duplicating a typewriter are, once more, more effectively achieved on a CRT.

Furthermore, forms, logos or other graphic information is often concurrently desired to emulate the functions of a typewritten manuscript. In both instances the size of memory and switching rates are high and reduction thereof are highly desired.

Finally, in order to achieve the most optimal use of any display system, it is necessary to separate the display from the internal operations of the remaining parts of any processor. As an example, some of the functions entailed in the simple process of editing text, including the refresh and other loads imposed by a display processor on the editing system, are large and any processor dedicated to such editing would therefore require both sophistication in architecture and, more particularly, sophistication in user's techniques. Accordingly, a display processor which is semiautonomous in its operation is desirable to accommodate the load division between any main processor, memory and IO devices.

In addition to the above considerations usually entailed in developing a successful display processor, there is further optimization that may be brought forth according to the present invention. For example, in most prior art displays, the graphic and text operations are entailed in a single system. Integrated into one system both of these functions dictate complex architectures which are further compounded by the cyclic features of a CRT.

SUMMARY OF THE INVENTION

An object of the invention is to provide a buffer system wherein overlapping character segments are directly superposed into a buffer system.

Other objects of the invention are to produce a video buffer system onto which overlapping signal inputs are directly overlayed to avoid cycling through a register.

Briefly these and other objects are accomplished within the present invention by combining a facsimile processor with a character generator in a display system using a CRT, where the character generator provides the character image components while the facsimile processor fills in the rest.

In order to provide the requisite image fidelty the picture element or pixel density of the CRT is approximately $1020\times1072$ in the vertical mode and $1320\times832$ in the horizontal mode (In this context, it is to be noted that emulation of a horizontally and vertically aligned page is facilitated herein). With this pixel density and the decay and flicker time constants of the CRT and human system a frequency bandpass of approximately 60 MHZ is required. Normal switching rates of commercial semiconductor memory chips are around 35 nanoseconds. Thus the switching rate of the horizontal line buffer, if such is to be made from commercial chips, becomes critical. Any superposition of data into such a buffer will therefore necessitate direct superposition rather than cycling through an ancillary register as is conventionally practiced. Furthermore, the loading or accumulation of a line in the horizontal line buffer is best done in fixed bit increments, e.g., in 16 bit increments. The 16 bit increment does not necessarily correspond to the escapement value associated with the dot pattern of the font. In fact the dot matrix selected for the font arrays is $12\times16$. This is further compounded by proportional spacing.

Thus two horizontal font segments of two adjacent characters may have to be inscribed, by parts, into a single 16 bit segment of the horizontal line buffer. The processing of characters, however, operates sequentially and the two adjacent segments are not available at the same time. Accordingly the input structure of the horizontal line buffer includes novel arrangements generally denominated herein under the label "write ones memory." This is accomplished through the use of the chip enable terminals for coding of input.

DESCRIPTION OF THE SPECIFIC EMBODIMENT

While the following description of a display processor is set forth in an environment of a word processing system, such is exemplary only. It is to be noted that the same techniques disclosed herein can be adapted to various other data processing applications and no intent to limit the scope of the invention by the examples set forth is expressed.

System Description

Figure 1:
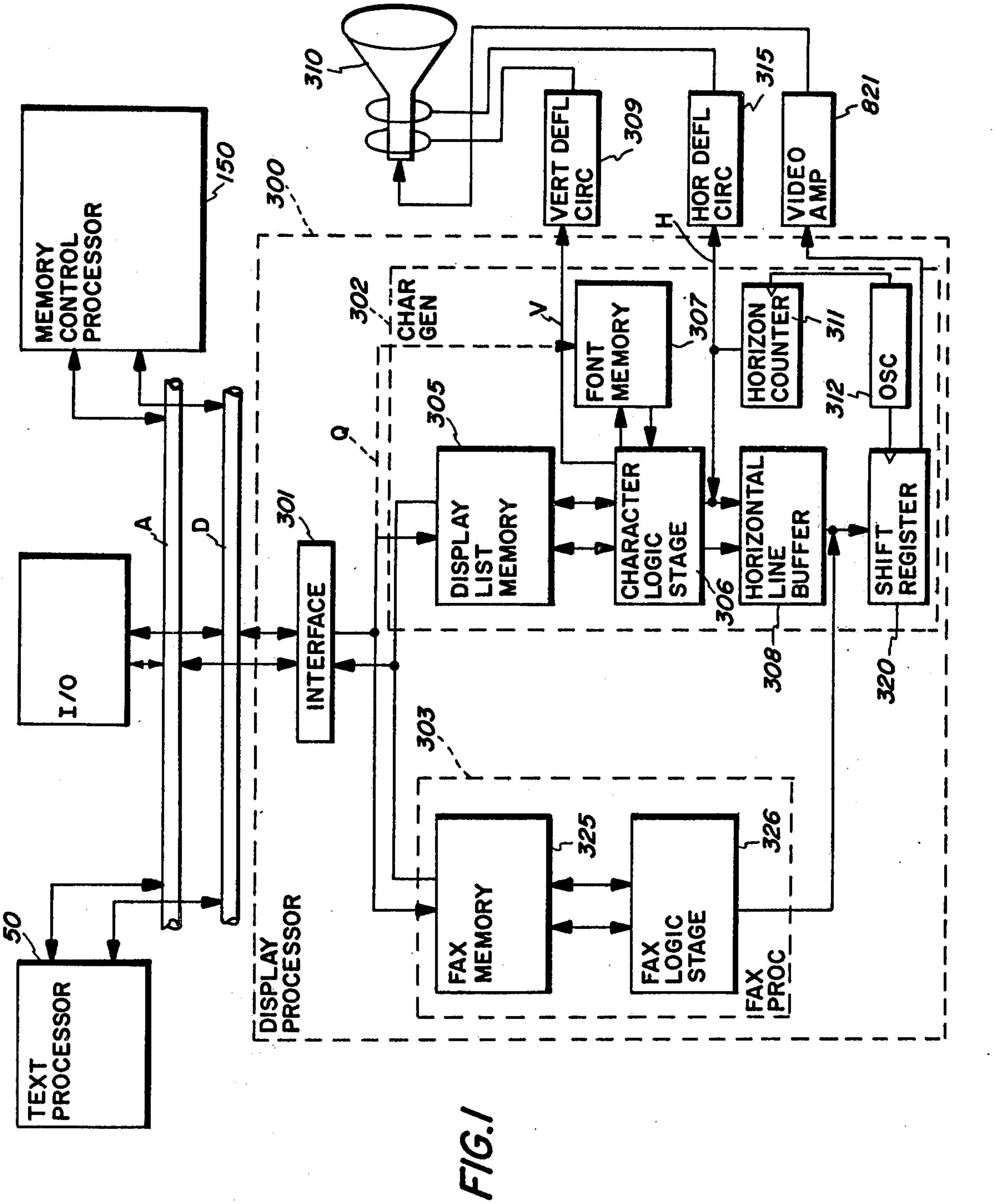
FIG. 1 is a block diagram illustrating the general arrangement of the system disclosed herein.

As shown in FIG. 1 a data processing system configured to include a main or text processor 50, a memory control processor 150 and a plurality of IO devices arranged in a manner similar to that described in a concurrently filed application, Ser. No. 769,594, filed Feb. 17, 1977, entitled "Soft Display Word Processing System". In a manner similar to that shown in the aforementioned patent, the various components are tied by way of two external buses, i.e., a data bus D and an address bus A to a bus interface 301 forming the input of a display processor 300 constructed according to the present invention. It is the arrangement of this processor 300 that is taken up herein.

More specifically, display processor 300 comprises two parallel data paths, i.e., a character generator segment 302 and a facsimile processing segment 303. Within the character generator segment 303, the bus interface 301 communicates with a display list memory 305. Memory 305 then applies its output signals to a character logic segment 306 which cooperates with font memory 307. Memory 307 may be any memory device such as, for example, a bank of static RAMS or in fact may be implemented by way of read only memory (ROM). In the present illustration, it is intended that the font memory 307 be loadable with various font patterns and for that reason a separate input is shown by way of a dashed input branch Q from the bus interface 301. Thus during the startup procedure of the processing system incorporating the presently disclosed display processor 300 the font memory 307 may be loaded with any desired dot matrices of various characters emulating a particular font. The display list memory 305, on the other hand, contains an interpretive list which is periodically interfacing with the bus system and which therefore includes the various system character operations as well as text manipulative instructions. For example, it may be desired to scroll the text on the display; should such be desired the display list memory will include the necessary instructions advancing the vertical coordinates of the text.

It is these instructions as well as the text that are continually applied to the display list memory 305 through interface 301. In addition items like cursor location (not shown) or similar inputs may be applied to the display list memory 305 through the interface stage and often it is these items that are also required in the next sequence of operations in the text processor. Thus the display list memory 305 communicates, both in and out, with the bus through the bus interface and in turn with the external bus system comprising buses D and A.

The output of character logic 306 is applied to a horizontal line buffer 308 organized as a ping pong buffer which accumulates, by segments, the data comprising a video signal while concurrently unloading into a shift register 320. A horizontal counter 311 driven by an oscillator 312 provides the clock signals to register 320 to produce a serial video signal to a CRT 310. Shift register 320 also receives the unfolded data stream from the facsimile processor 303 thereby combining the graphics data with the character data. In addition, horizontal counter 311 provides the horizontal deflection signal H which, through conventional circuitry exemplified herein by horizontal deflection circuit 315 controls the horizontal beam deflection while the character logic stage 306 provides the vertical signal V, through conventional circuitry exemplified by vertical deflection circuit 309 controls the vertical beam deflection.

More specifically the facsimile processor 303 includes a memory 325 storing in compressed format various segments of graphic information. In order to match up the tube displacement with the output of the facsimile memory there is included a facsimile logic stage 326 which unfolds the compressed data into bit by bit format, providing a bit stream in increments to the shift register 320 to be summed in with the character signals thereat. Accordingly the shift register 320 operates to combine both the character and the facsimile segments of the image and the character logic 306 and facsimile logic 326 therefore must be synchronized in their corresponding coordinate outputs. The structure of each data path is separated and as one option it is intended to operate the foregoing system through the character generator only.

Character Generator System

Figure 2:
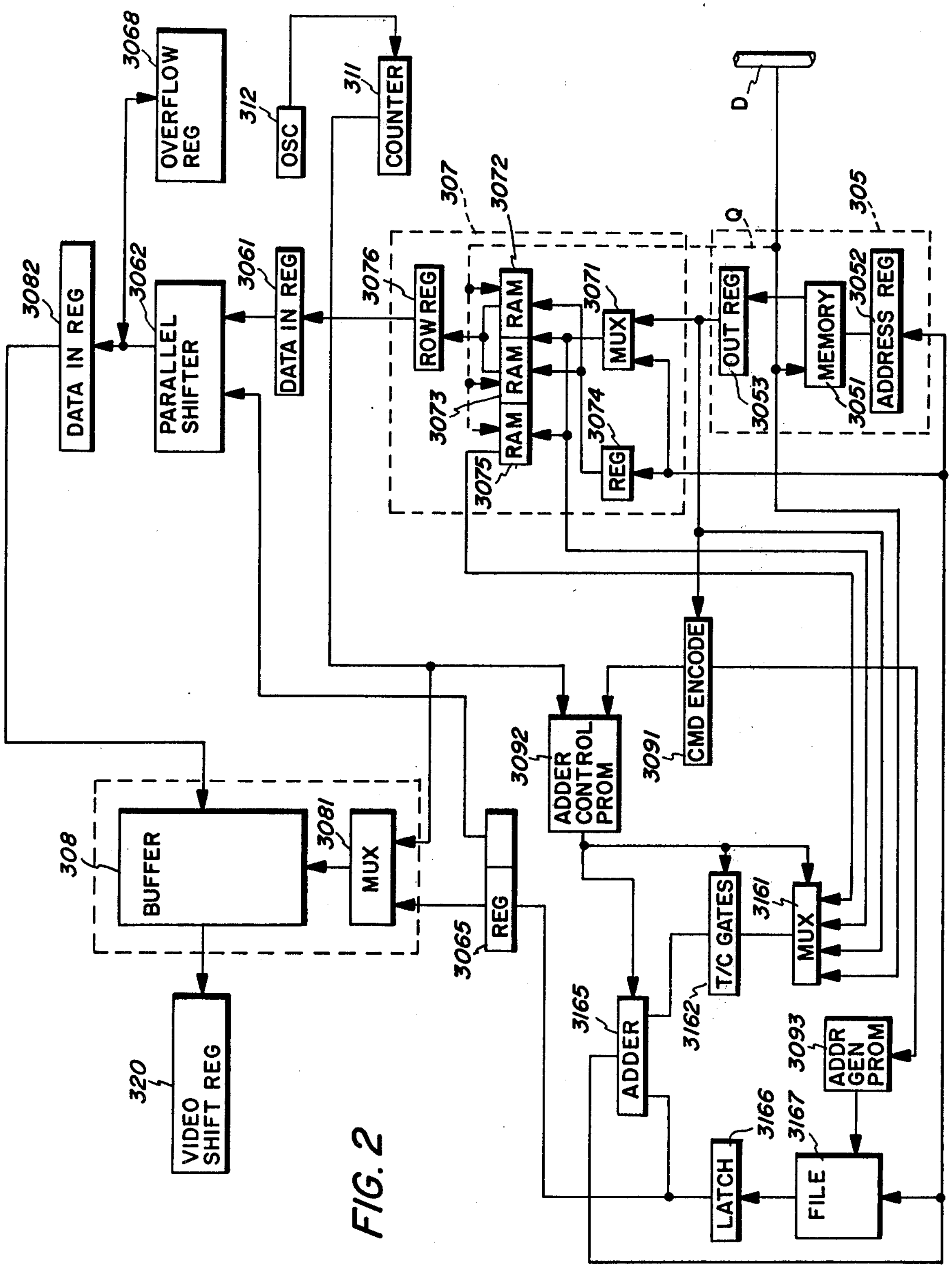
FIG. 2 is a logic diagram of a character generator incorporated in FIG. 1.

With the foregoing general system layout the detailed arrangement of the character generator 302 will now be taken up. As shown in FIG. 2, the display list memory 305 comprises 4 K×16 semiconductor memory 3051 which is addressed by an address register 3052. The data inputs to memory 3051 are received from the D bus and the data outputs are in turn tied to an output register 3053 which provides one of the data inputs to a multiplexer 3071 forming the front end of the font memory 307. It is the output of this multiplexer 3071 that selects the particular dot pattern corresponding to the character code appearing at the output of the list memory 305. Furthermore mux 3071 multiplexes the full word memory output into two half words during ½ word (byte) commands of which display character codes are a subset of the byte commands. Mux 3071 can be of conventional construction such as, for example, the multiplexer made by Texas Instruments under Model No. SN74S153.

More specifically, the loadable font memory comprises two RAMs 3072 and 3073 which are addressed by the multiplexer 3071 and a vertical displacement register 3074. As set out previously, the dot pattern for each character is in the form of a matrix 16 bits high and 12 bits wide. Register 3074 provides the vertical coordinate while multiplexer 3071 selects the character. Associated with RAMs 3072 and 3073 is a horizontal displacement RAM 3075 storing the horizontal escapement associated with the corresponding character. RAMs 3072, 3073 and 3075 are initially loaded by way of the signal Q from bus D with the necessary dot patterns and escapement values emulating a typewriter. The selected character is then brought out, row by row, into a character row register 3076.

For the purposes herein register 3076 is a 12 bit register receiving the full 12 bits of the font array regardless of the actual width of the character. This data is applied to yet another register 3061 forming the data input end of the logic 306. The output of register 3061 is in turn applied to a parallel shifter 3062. It is to be noted that the 12 bits of font data are applied to the shifter 3062 without any reference to its relative position along the video scan. Accordingly logic 306 further includes arithmetic functions which determine or provide the shift commands to the parallel shifter 3062. Parallel shifter 3062 can be of conventional construction such as, for example, the parallel shifter produced by Advanced Micro Devices under Model No. 25S10.

More specifically, the escapement data from RAM 3075 is applied as one data input to a multiplexer 3161. Additionally, via a command filter and encoder 3091 which in turn selects an adder control code in a prom 3092 and an address code out of a prom 3093. Proms 3092 and 3093 are further controlled by a less significant bit output of counter 311 and therefore are phase related to the main clock (or oscillator 312). Further inputs to the same multiplexer 3161 originate at the D bus and at the partial output of multiplexer 3071. Multiplexer 3161 then selects this data input according to the state of the instruction execution of the list memory 3051 instruction. The selected data from multiplexer 3161 is then applied to a set of gates 3162 at the B input of an adder 3165. A latch 3166, in turn, receives the A input to the adder from a file 3167 cycled by the address generating PROM 3093. The output of adder 3165 is circulated back to the file 3167 and the input register 3052. An additional function of the adder 3165 is used to calculate the proper row in the font array and that value is stored in the font displacement register 3074.

Latch 3166, besides its function as the A input to adder 3165, also periodically provides the horizontal displacement code to a register 3065. This is in terms of 11 bit code to accommodate the maximum bit width of the screen, 7 of the 11 bits being utilized to provide a first data input to a multiplexer 3081 which selects the address inputs of the horizontal line buffer 308. The other data input to multiplexer 3081 comprises a 9 bit signal from counter 311. Thus multiplexer 3081 selects either the horizontal coordinate calculated and stored in file 3167 or the horizontal counter coordinate for the location of the data input to buffer 308. The least significant 4 bits of register 3065 are used to control the shift position of shifter 3062. This allows for lateral adjustment of the 12 bit font array to accommodate proportional pitch spacing. If any lateral shifting is required, the potential overflow from shifter 3062 is stored in an overflow register 3068 to be applied into the next 16 bit word. Shifter 3062 and register 3068, in combination, load a data input register 3082 which provides the 16 bits of data input to the horizontal line buffer 308. Shifter 3082 can be of conventional design such as, for example, the shifter made by Texas Instruments under Models SN74S170–174.

In this manner, a single list memory can be used to produce an output which is eventually synchronized with the video sweeps in the CRT of display 310. The use of a list memory which both includes character codes and instructions provides the necessary interpretive characteristics and in particular eliminates the necessity of a similar memory in the host system. Since it is the list memory that is interfacing with the bus system further advantages are realized; e.g., a significant reduction in bus traffic occurs snce all of the video associated tasks are handled locally. Furthermore, memory cost is optimal both character codes and instructions being received indiscriminately into appropriate list addresses.

The use of a list memory with embedded commands, however, renders any operations within the display processor asynchronous. For this reason a horizontal line buffer is required to collect the asynchronously developed data for video synchronized output. The details of this buffer 308 are therefore further developed herein.

Video Line Buffer

Figure 3:
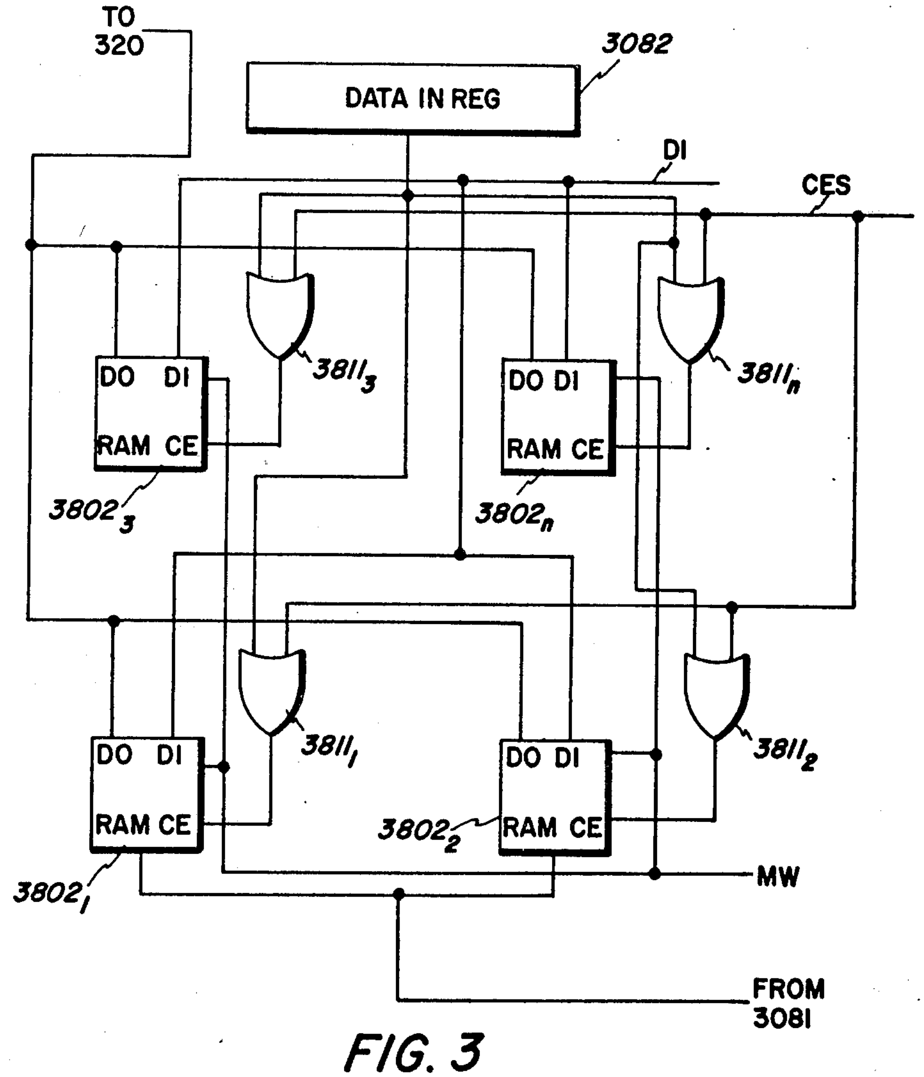
FIG. 3 is a logic diagram of a buffer arranged to operate as a write one's memory for use herein.

By reference to FIGS. 2 and 3, the structure of the horizontal line buffer will now be taken up. As shown in FIG. 3, buffer 308 receives an address input from multiplexer 3081 addressing in parallel a plurality of memory chips or RAMs $\mathbf{3802}_{l\text{-}n}$. In this instance 1 bit wide RAMs are contemplated such as the Fairchild Model No. 93415. By arranging a 16 chip wide array of chips 3802, a 16 bit word is formed. The word location, in turn, is selected by internal address decode circuits in memory chips 3802.

During operation the character logic stage 306 determines partial video line segments in word organized groups that are written into the horizontal line buffer 308. The buffer operates in a ping-pong mode. That is, one-half of the buffer is dedicated to output while the other half is dedicated to input. When the output half is emptied, the buffer halves are reversed and the process is repeated. During output, each word from the buffer is consecutively read, transferred to the output shift register 320, and the word is cleared, i.e., a zero value is written into the word. Thus, at the completion of an output cycle a cleared half buffer becomes available for data input.

It is to be noted that the data segments previously determined by logic stage 306 are not necessarily consecutive and, in addition, may overlap. Therefore, it is necessary during the writing of data from logic stage 306 that a write one's operation occur to allow merging of data during the formation of a video line by logic stage 306. It should be further noted that both input and output operations occur simultaneously by assigning time slots which are relatively small with respect to a line time for input and output operations. Consequently, simultaneous input-output occurs through time division multiplexing. Because the demands of input-output are high it is necessary to reduce the cycle sequences of the buffer. Traditionally, a write one's cycle (merge) is accomplished by first reading the required memory location into a data register, merging the new data, and finally re-writing the data register back into the memory.

It is an objective of this implementation to reduce the operation by selective control of the chip enable inputs of RAMs $\mathbf{3802}_{l\text{-}n}$. Specifically, during a write one's cycle data patterns from register 3082 control the *C*hip *E*nable, CE, inputs on RAMs $\mathbf{3802}_{l\text{-}n}$ via OR-gates $\mathbf{3811}_{l\text{-}n}$. Simultaneously, a common *D*ata *I*nput line, DI, is held at logic '1'. After allowing sufficient time for address decoding, a common *M*emory *W*rite line (MW) is operated long enough to properly write ones into the selected words of the selected memories. Note that all other memory elements remained undisturbed since their respective CE inputs were not active.

In order to write zeroes into a selected word during an output operation, a common *C*hip *E*nable *S*elect (CES) term is enabled, activating all CE inputs of devices $3802_{l-n}$ via OR-gates $3811_{l-n}$. Additionally, the common DI term is held at logic '0'and again after proper allowance for address decode, the common write line (MW) is operated.

Further, to read an output word, the common chip enable select (CES) term is enabled and after proper allowance for address decode and data output response, the data output lines are transferred to the data output shift register 320.

Figure 4:
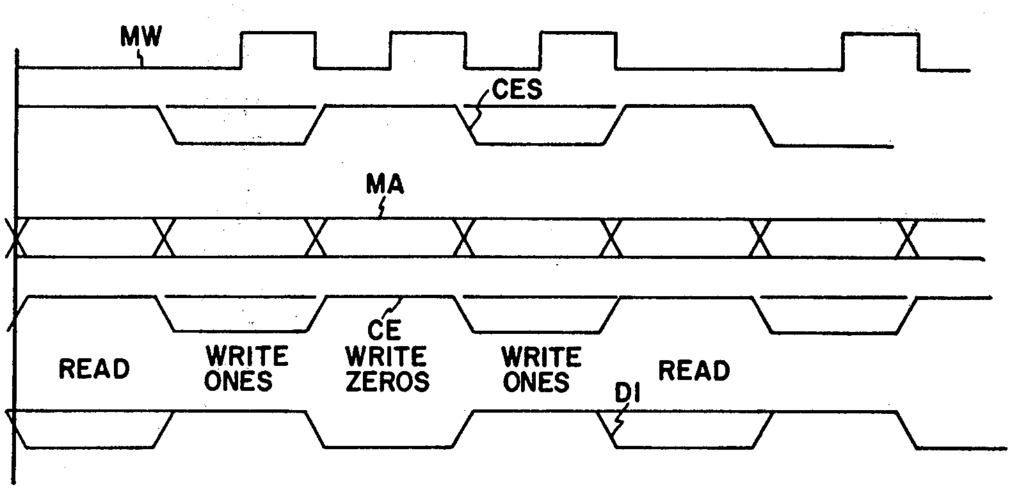
FIG. 4 is a timing diagram associated with FIG. 3.

To highlight this operation further, reference should be had to FIG. 4. In this figure the memory address lines (MA) from address multiplexer 3081 change state with each buffer operation. In the timing illustrated two write one's (input) operations (signal DI) occur for each read-write zeroes (output) operations.

With the foregoing description of parts, the general arrangement of the character logic segment 306 is set forth. Before proceeding with the operative description, it is first necessary to set forth the concurrent arrangement of the display list memory 305. The display list memory 305 is organized as a 4 K×16 bit per word memory each 16 bit word including two 8 bit bytes. Each word, furthermore is accompanied by an address code. Thus at address coordinates 00 the first word is inscribed. This word may contain either a instruction or an actual character code.

Figure 5:
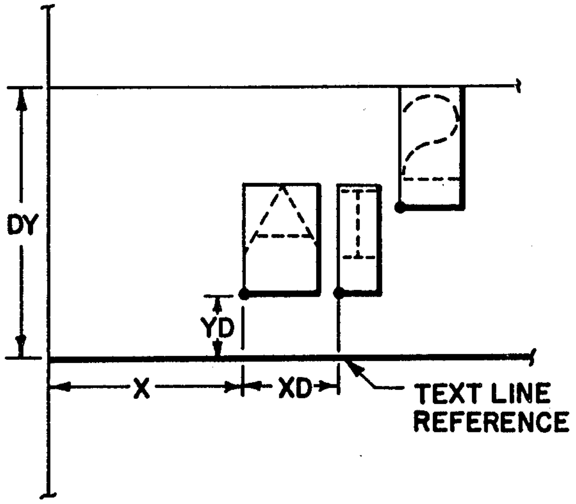
FIG. 5 is an exemplary video image segment generated according to the invention herein.

Nine display instructions provide the flexibility necessary to emulate typewriter test. A table following defines the display instructions and FIG. 5 illustrates the basic character positioning notation. In order to display the text line illustrated in FIG. 5, the list would start with an STY defining the height of the text line (DY) in raster line units followed by an STX defining the origin (lower left corner) of the character from the left edge. An SYD displaces the character from the bottom of the imaginary text line by YD units and DCH would command the writing of an "A". Since the character displacement (XD) is stored with each character, the X value will be replaced by X+XD after execution of each DCH command. Overstrike may be effected by repositioning X by STX at any time. Subscripts and superscripts can be invoked by changing the value of YD with the SYD command. A text line is terminated by an ETL command which jumps to the list address defined in the instructions. The complete instruction set for the text line in FIG. 5 is:

STY(DY)←enter from previous text line
STX (X)
SYD (YD)
DCH (A)
DCH (I)
SYD (YD)
DCH (2)
.
.
.
ETL (LA) →exit to next line The partitioning of the display page into an ordered set of text line characterizations facilitates scrolling and interactive display operations. Instantaneous changes may be achieved with only minor modification of the memory 305 contents. Text lines may be readily linked and delinked by chaining the arguments of the ETL instructions. Also, scrolling can be accomplished by establishing a vector to the first displayed text line. If scrolling is desired in finer resolution than one text line, the DY value of the first text line's STY may be appropriately modified.

The display screen format can either emulate a vertical text page of 8-½×11 inches or a horizontal text page of 11 ×8-½inches, respectively. The resulting emulation resolution is 96 lines per inch × 120 pixels/inch which is compatible with both present typewriter coordinate systems and facsimile resolution.

The following table sets out the instructions:

| MNEMONIC | DESCRIPTION |
|---|---|
| DCH (CH) | Display character specified by (CH) |
| SYD (YD) | Set character displacement to (YD) |
| SCM (I,B,U) | Complement the state of the displayed character attributes invert (I), blink (B), and underscore (U) |
| SPX (SP) | Display a space character of width (SP) |
| NOP | No operation |
| STY (DY) | Start new text line with spacing (DY) |
| STX (X) | Set the X register to (X) |
| ETL (LA) | End the text line and jump to list address (LA) |
| JMP (LA) | Jump immediately to list address (LA) |

The Facsimile Processor

As illustrated above, the above described character generator system is operating concurrently with the facsimile processor 303. It is to be noted that in the interest of cost the size of the fax memory 325 is necessarily optimized. In view of the applicable use of the display processor contemplated herein various techniques for compression are available. Most optimal compression, however, is what is commonly referred to as area encoding. Typically any document (business form, letterhead) is predominantly white, having few symbols and figures dispersed thereon. A bit by bit reproduction of that document would therefore necessarily entail large memory space dedicated to store repeated white codes and any technique for reducing storage of redundant information significantly reduces the cost and complexity of the facsimile system. In the present environment, however, the facsimile processor works in conjunction with the character generator and therefore has imposed thereon time constraints dictated by the volatility of the video tube 310 and also the filtering characteristics of a human eye. Thus any compression technique must be decompressed or decoded within the time interval allowed for the repetitive image production through the video tube. Accordingly it is this combination of area compression and unfolding within the time rate of the video tube that sets the basis for the following description of the facsimile processor.

Figure 6:
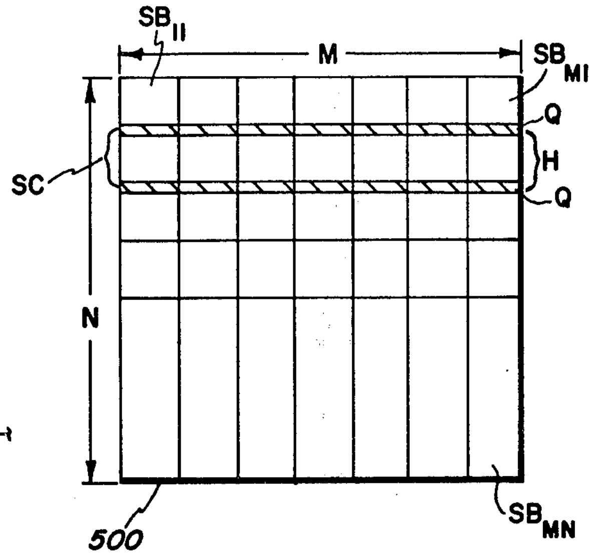
FIG. 6 is a matrix breakdown of a video image useful herein.
Figure 7:
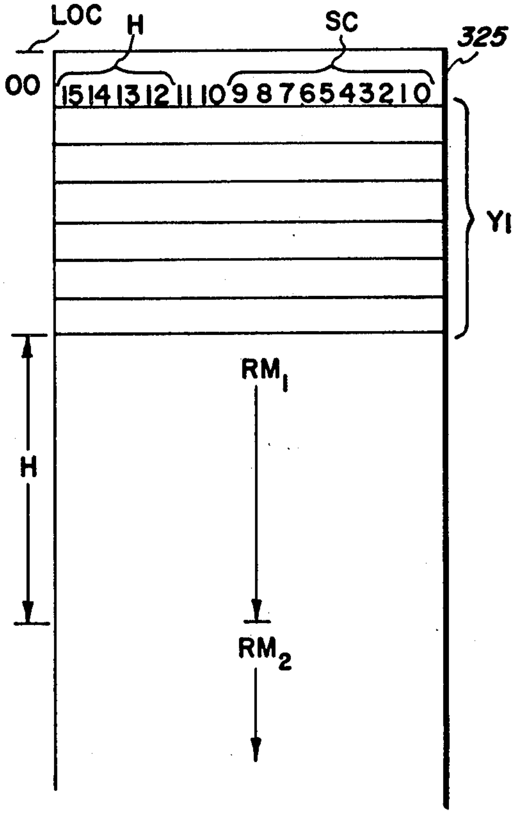
FIG. 7 is a memory field assignment useful herein.

As shown in FIG. 6 a document, whether it be the document actually displayed or a document loaded into memory, designated herein by the numeral 500 can be broken down into an M×N array of area segments $SB_{mn}$, each segment having a fixed pixel width and predetermined pixel height referred to herein as the height H. Shown between the first and the second row of segments or segment arrays is a hashed marked row indicating what is referred to herein as a differential Q. It is to be noted that text and various other images often are arranged in rows which are separated from each other by intervals for clarity. Thus very often the data content in one row is separated from another row by some skipped rows of all white data referred to herein as the differential Q. The summation of the value of a given segment pixel height H and the immediately preceding differential Q is referred to herein as the skip count SC. By way of this arrangement there is always a fixed number of arrays extending horizontally across the image, i.e., a number of arrays M, having a selected height H and being separated from the preceding row by a difference Q. Accordingly, each matrix row is preceded by a leader word of 16 bits having bits 15 through 12 identifying the height and bits 11 through 0 identifying the skip count SC. This is illustrated in FIG. 7. More specifically as shown in this figure the segment H is the height segment shown residing in bit positions 15 through 12 and the segment SC is the skip count segment residing in bit positions 11 through 0. This header is then followed by a 83 bit Indicating Vector code IV consisting of six 16 bit words indicating which matrix segments $SB_{mn}$ include black data across the row. This is then followed by the various dot matrices $RM_{1\text{-}X}$ making up the pixel content of those segments indicated by the IV vector.

It is to be noted that the matrix groups are further reduced by a first overlay of what is referred to herein as predictive encoding.

Predictive encoding of the graphics bit map tends to reduce the total number of black pixels, thereby increasing compression efficiency of the subsequent area encoding. Each scan line is divided into segments of 16 pixels each, making a total of 64 segments for vertical format (83 segments for horizontal format). The last pixel of every segment is used to predict all 16 pixels of the next segment. Letting the value of an actual bit map pixel be donated by:

$P_{n,i}=0$: white pixel ($1\leqq n\leqq 64/83$)

$P_{n,i}=1$: black pixel ($0\leqq i\leqq 15$)

where "n" is the segment containing the pixel, and "i" is the pixel position within a segment and the rightmost pixel position within a segment corresponds to $i=15$ the following transformation to the scan line occurs:

$$\hat{P}_{n+1,i}=P_{n,15}\oplus P_{n+1,i}$$

$n=1, 2, \ldots, 63/82$ $i=0, 1, \ldots, 15$ where $\hat{P}_{n+1,i}$ denotes a prediction error pixel. Clearly, any actual pixel $P_{n+1,i}$ which is identical to $P_{n,15}$ will be replaced by a prediction error pixel with value 0. The actual scan line can be recovered from the prediction error scan line by application of the same transformation:

$$P_{n+1,i}=P_{n,15}\oplus\hat{P}_{n+1,i}$$

$n=1,2, \ldots, 63/82$ $I=0,1, \ldots, 15$

Predictive encoding of the first segment of a scan line is accomplished by judicious choice of an initial prediction bit.

Predictive encoding of a horizontal line covering 4 segments is illustrated below. Note that the encoding has created 2 additional void segments. Encoding of longer lines would tend to create a larger number of void segments.

| |
|---|
| 00...00'0000111111111111'11...11'11...11'1111111111111100'00...00 |
| Actual scan line portion (6 segments) |

-continued

| |
|---|
| 00...00'0000111111111111'00...00'00...00'0000000000000011'00...00 |
| Prediction error scan line portion (6 segments) |

The predicted bit map is then divided into matrix groups in preparation for area encoding. Thus where all pixels of each scan line of a matrix group are identical to the rightmost pixel of each corresponding scan line at the prior matrix group a void matrix is generated which is reflected in the indicating vector IV. It is this data storage format that is utilized in the facsimile processor described herein.

Figure 8:
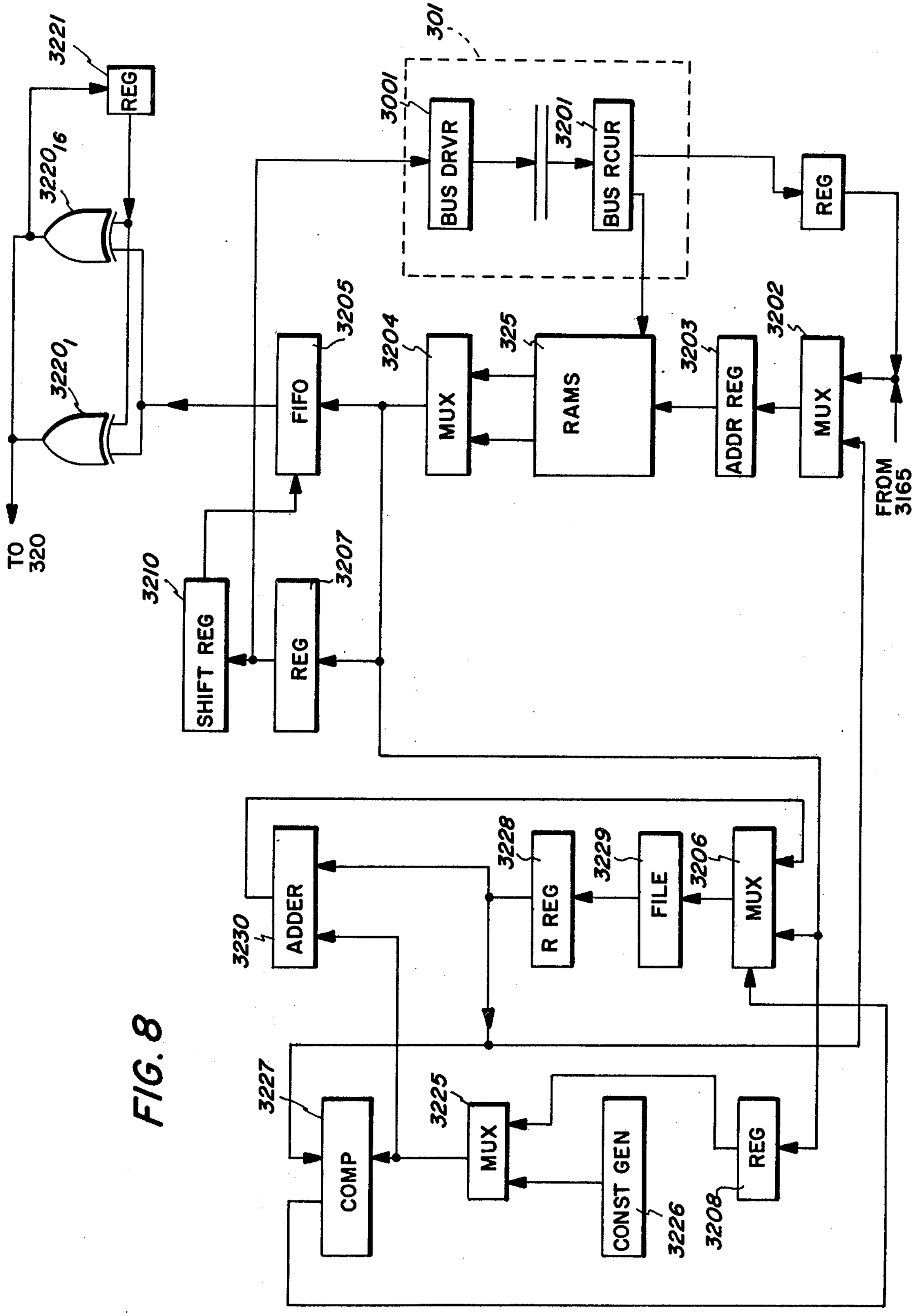
FIG. 8 is a logic diagram illustrating a graphics processor useful in FIG. 1.

More specifically as shown in FIG. 8 memory 325 comprises a plurality of RAMs. Memory 325 is loaded from the external bus system by a bus receiver 3201 providing a 16 bit data input. The address input is developed at the output of a 2:1 multiplexer 3202 which loads an address register 3203. This data is thus arranged in the compressed form described in memory 325. Because of the video bandwidth the data is extracted from memory 325 in two 16 bit words as the two data inputs of an output multiplexer 3204. The 16 bit output of multiplexer 3204 is applied to a 4 word FIFO 3205, to a multiplexer 3206, an output register 3207 and a height register 3208. It is the four word FIFO 3205 that decouples effectively the accesses to memory 325 from the video bit stream. The FIFO 3205 is strobed by a vector storage register 3210 loaded by register 3207 with the vector bit stream unloaded prior to the matrix groups and the output of the FIFO is then applied to a bank of exclusive OR gates $\mathbf{3220_1}$–$\mathbf{3220_{16}}$ which either invert or directly transmit the 16 bit word according to the state of a 1 bit register 3221 storing the prior rightmost bit position, i.e., the output of gate $\mathbf{3220_{16}}$. This last set of logic elements therefore enables the decompression of the predictively compressed matrices.

As previously stated, the output of multiplexer 3204 also loads the four bit height register 3208 with the H dimension. This height dimension is applied as one input to a multiplexer 3225, the other input of this multiplexer receiving a constant from a constant generator 3226. The output of multiplexer 3225 is then applied to a comparator 3227 which at the other input is loaded with the output of an R register 3228. Register 3228, in turn, is loaded by a 4×16 file 3229 storing the output of multiplexer 3206. The outputs of multiplexer 3225 and register 3228 are furthermore applied to an adder 3230 which returns its output back to the other data input of multiplexer 3206. This 13 bit input is circulated through register 3228 to advance the address of address register 3203. In this manner, the skip count SC is accommodated in comparator 3227 and once an equality is reached address register 3203 and R register 3229 are controlled to advance row by row through the matrices in memory 325.

To complete the loop the outputs of gates $\mathbf{3220_1}$–$\mathbf{3220_{16}}$ are applied to shift register 320 and a bus driver 3001 and receiver 3201 complete the bus interface 301.

Video Control

Figure 9:
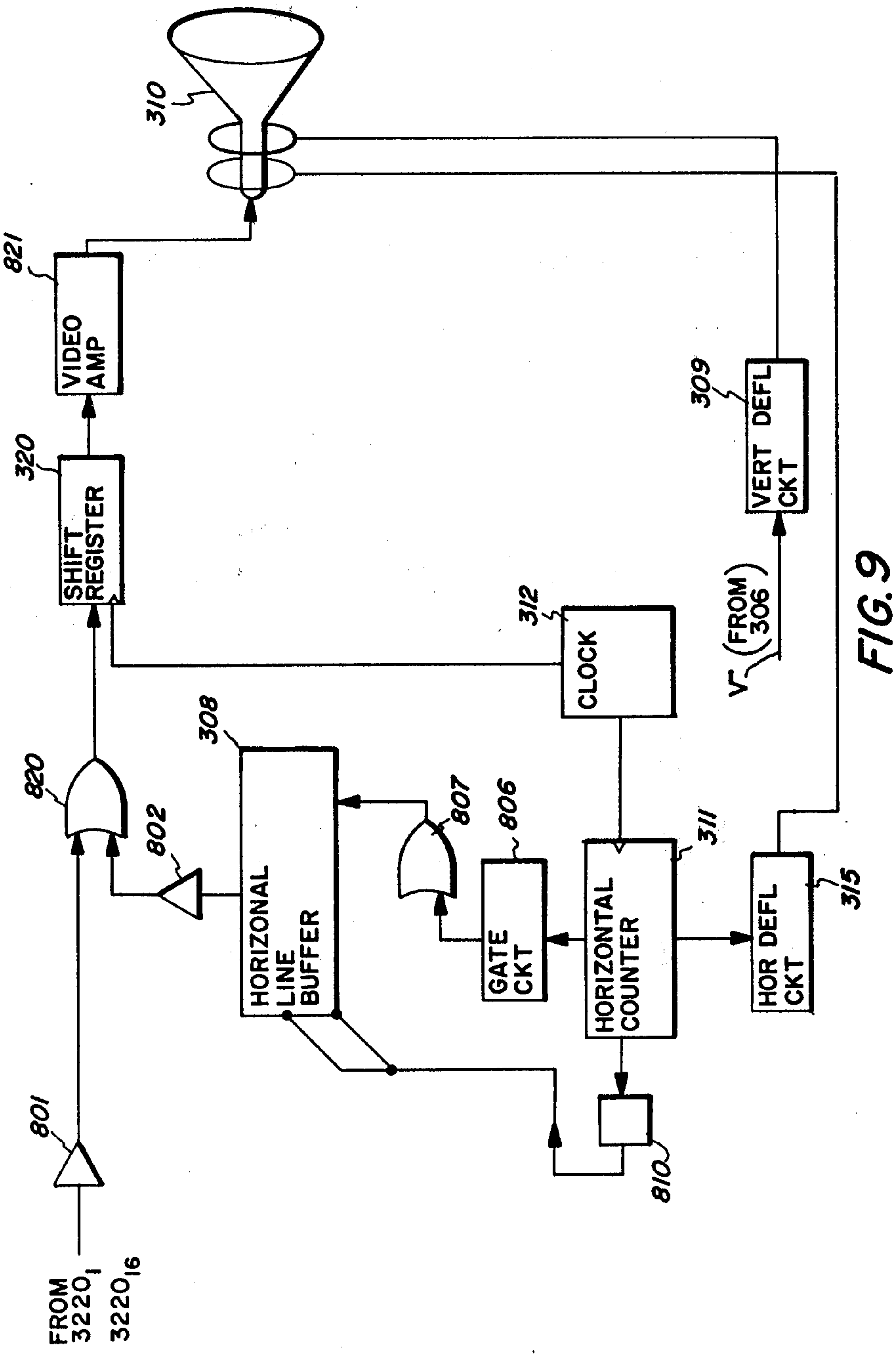
FIG. 9 is a logic diagram of a video control system useful herein.

At this point, the interconnection of the horizontal line buffer 308, the horizontal counter 311 and the video output register 320 will be taken up together with the function of the deflection circuit 309 and 315. Reference should be had to FIG. 9 for this description. As shown in FIG. 9 the 16 bit output from the gates $\mathbf{3220_1}$–$\mathbf{3220_{16}}$ merges with 16 bits of data from buffer 308 by the wired OR symbolically shown as gate 820. To facilitate a continuous flow of data, buffer 308 is conformed as a two halves buffer assembly, each half alternatively enabled for write and read operation. This is accommodated by a ping-pong flip-flop 810 which changes state on each overflow (carry) of the counter 311. Counter 311 is therefore a continually running counter accumulating the clock rate of oscillator 312 which also controls the transfer of the combined facsimile generator and character generator data via gate 820 to shift register 320. The result is an overlayed data flow from the character generator stage 302 and the facsimile stage 303 which are then serially applied to a video amplifier (including grid mix and blanking) circuit 821 which provides the conventional video functions associated with tube 310.

Concurrently the outputs of counter 311 are applied to the above described deflection circuit 309 which also entails the necessary sync and blanking signals, again accomplished in a manner known in the art. Deflection circuit 315 is, in turn, driven by the signal V from the character logic stage 306 to provide the vertical count for the video image.

It is to be noted that the above description entails some symbolic illustration and is abbreviated in the deflection details in the tube. In each instance either repetitive implementation of the device shown will suffice or recourse should be had to conventional circuits in the video art.

Obviously many modifications and variations to the above disclosure can be made without departing from the spirit of the invention. It is therefore intended that the scope of the invention be solely dependent on the claims hereto.

I claim:

1. Apparatus for overscribing binary data of a selected polarity into a semiconductor store, comprising:

a source of a data signal of a selected electrical polarity;

a semiconductor store including an array of memory chips each enabled by a corresponding chip enable signal, each memory chip including a read/write terminal for selecting the direction of data transfer thereby and a data-in terminal connected to said source for receiving said data signal of said selected polarity;

addressing means including signal generating means for providing a write signal to said read/write terminals in lagging relationship relative to said chip enable signals for selecting storage locations for said data signal within said memory chips for write-in of the data signal at those selected locations;

means for generating a common logic signal;

a data register having stored therein a plurality of binary signals; and a plurality of gates each connected to provide said chip enable signals to selected ones of said memory chips in response to receipt of one of said binary signals from said data register and said logic signal for enabling said memory chips to selectively store said data signal of said selected electrical polarity.

2. Apparatus according to claim 1 wherein:

said binary data is of a binary one polarity.

* * * * *